(12) United States Patent
White

(10) Patent No.: US 6,810,124 B1
(45) Date of Patent: Oct. 26, 2004

(54) ADAPTIVE RESONANCE CANCELLER APPARATUS

(75) Inventor: Stanley A White, San Clemente, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 09/414,116

(22) Filed: Oct. 8, 1999

(51) Int. Cl.[7] .................. H03B 29/00; H04R 27/00; H04B 15/00

(52) U.S. Cl. ............... 381/71.1; 381/94.2; 381/83; 381/93

(58) Field of Search ............... 381/71.1, 71.2, 381/71.4, 71.9, 71.11, 328, 330, 333, 94.2, 83, 93

(56) References Cited

U.S. PATENT DOCUMENTS

| | | | |
|---|---|---|---|
| 4,035,734 A | 7/1977 | Flormann et al. | 328/167 |
| 4,063,183 A | 12/1977 | Evans | 328/163 |
| 4,091,236 A | 5/1978 | Chen | 179/1 |
| 4,177,430 A | 12/1979 | Paul | 325/475 |
| 4,287,475 A | 9/1981 | Eaton et al. | 328/167 |
| 4,679,001 A | 7/1987 | West | 328/167 |
| 5,113,139 A | 5/1992 | Furukawa | 324/623 |
| 5,192,918 A | 3/1993 | Sugiyama | 328/165 |
| 5,227,743 A | 7/1993 | Yamamoto | 333/17.1 |
| 5,331,299 A * | 7/1994 | Smith | 333/175 |
| 5,396,414 A | 3/1995 | Alcone | 364/148 |
| 5,625,317 A | 4/1997 | Deveirman | 327/353 |
| 5,960,091 A * | 9/1999 | White et al. | 381/98 |

\* cited by examiner

*Primary Examiner*—Xu Mei
*Assistant Examiner*—Elizabeth McChesney
(74) *Attorney, Agent, or Firm*—Harness Dickey & Pierce P.L.C.

(57) ABSTRACT

An adaptive resonance canceller system and method for attenuating narrowband noise signals within an input signal, where the narrowband noise signals may vary significantly in frequency. The sensor comprises a notch filter, an error reference and gradient generator, and a complex correlator circuit for attenuating the narrowband noise component of the input signal. The input signal is applied to the notch filter and to the error reference and gradient generator. The latter component generates an error reference signal and an error gradient signal. These two signals are applied to the complex correlator circuit which, in turn, generates a tuning parameter signal which is applied to the notch filter to tune the filter to the center frequency of the noise component of the input signal. The tuning parameter signal is also applied in closed loop fashion to an input of the error reference and gradient generator such that the error reference and error gradient signals can be modified in accordance with the changing frequency of the noise component. The system and method are particularly well adapted for use with solid state sensors used for generating body rate signals for attitude control in a flight control system, wherein it is undesirable to introduce any phase shift to the body rate signal.

15 Claims, 5 Drawing Sheets

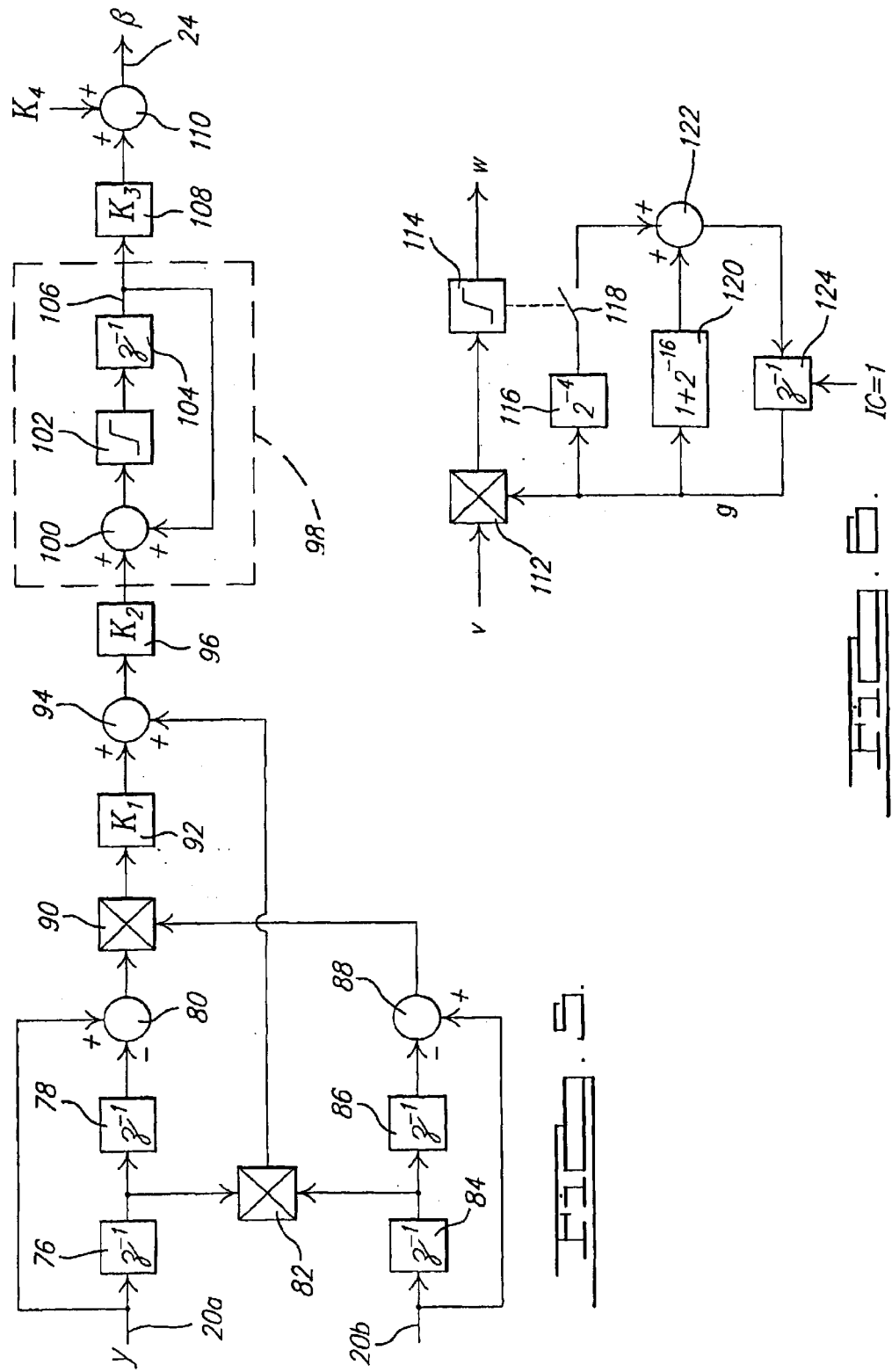

ADAPTIVE RESONANCE CANCELLER APPARATUS

TECHNICAL FIELD

This invention relates to an apparatus and method for attenuating unwanted narrow band noise, and more particularly to a method and apparatus for tracking and attenuating a narrow band noise signal which drifts in frequency, while minimizing the delay of the filtered signal.

BACKGROUND OF THE INVENTION

BACKGROUND ART

Airframe-mounted solid-state sensors are used with aircraft to generate a body-rate signal for attitude control in a flight-control system. This body-rate signal is sometimes contaminated by a large narrow band-noise signal caused by a resonant mode within the sensor being driven by a wide band vibration noise. The Q of the resonant element can be on the order of several thousand. Simple low pass or band pass filtering cannot be used to eliminate this narrow band noise because such filtering introduces excessive phase shift in the flight-control channel. If the frequency range of this noise could be restricted to a couple of hertz, then a fixed, narrowband notch filter could provide adequate attenuation without introducing excessively large phase shift. Unfortunately, the frequency deviation is not always very small with such narrow band noise signals. This is in part because the resonant frequency of these signals is temperature and time dependent. The resonant frequency may also be affected by variations and atmospheric pressure and other factors affecting operation of the sensor.

There presently is not a solution to the problem of attenuating narrow band noise signals which vary significantly in frequency. Fixed narrow band notch filters have been used successfully to attenuate narrow band noise when the center frequency of the noise has been tightly controlled. By opening the specifications on the noise center-frequency variance, more sensors are able to pass acceptance tests, thereby lowering unit costs. The acceptable temperature ranges of the sensor can also be expanded because the frequency of the narrow band-noise signal is temperature sensitive. However, previously developed systems still have not been able to successfully track and attenuate a narrow band noise signal which varies significantly in frequency while minimizing delay or phase shift in the signal path.

Previously developed systems have suffered from a variety of other drawbacks. Some presently available systems work well for sinusoidal noise signals but not for random narrow band noise signals. Some systems require a more fully or distinctly specified noise. Additionally, some systems have implemented an adaptive filter, but the functioning of the filter has been limited unless the statistics of the noise met certain prescribed criteria. With other filtering systems, the necessary performance requirements (notch depth, tuning bias, etc.) were simply not achievable.

Accordingly, it is a principal object of the present invention to provide an adaptive resonance canceller system and method for tracking and attenuating unwanted narrow band noise within a large frequency spectrum, and without introducing significant phase shifting of the filtered signal.

It is yet another object of the present invention to provide an adaptive filter for attenuating large narrow band noise signals present in an output signal of a solid-state sensor, wherein the narrow band noise signal varies significantly in frequency, and where a notch filter for removing the narrow band noise signal is tuned, in real time, such that it tracks the center frequency of the narrow band noise signal to thus enable attenuation of the noise signal, and further without introducing significant phase shift of the sensor output signal.

SUMMARY OF THE INVENTION

The present invention relates to an adaptive resonance canceller system and method for attenuating a large narrow band noise signal within a sensor output signal, where the narrow band noise signal may vary significantly in frequency. The system of the present invention generally comprises a notch filter for removing the unwanted narrow band noise signal from the sensor output signal. The sensor output signal is further input to an error reference and gradient generator which generates an error reference signal and an error gradient signal. These signals are input to a complex correlator system which produces a tuning parameter signal for precisely tuning the notch filter to the center frequency of the narrow band noise signal. This tuning parameter signal is applied to the notch filter to thus tune the notch filter, in real time, to a center frequency of a narrow band noise signal such that the filter can attenuate the noise signal. Advantageously, this action is performed without introducing any tangible phase shift into the output signal of the sensor. The tuning parameter signal is also applied, in closed loop fashion, to the error reference and gradient generator such that the error reference and error gradient signals applied to the complex correlator system can be modified in accordance with the changing frequency and magnitude of the narrow band noise component of the sensor output signal.

In the preferred embodiment, the output signal from the notch filter has a frequency spectrum which is substantially identical to that of its input signal (i.e., the sensor output signal) but without the narrow band noise component being present. The notch filter comprises a gain scaling multiplier, a biquadratic allpass filter and an adder. In the preferred embodiment the biquadratic allpass filter comprises a well known, second order, recursive, single-multiplier-per-order Gray-Markel allpass lattice filter whose design has been optimized for $L_1$ scaling.

The error reference and gradient generator comprises a bandpass filter, an automatic gain control, a scaling element, an allpass filter, an adder, a subtractor, and a delay element. The bandpass filter frequency is selected to have a passband range to accommodate the expected maximum and minimum frequencies of the narrow band noise component of the sensor. The scaling multiplier, the allpass filter, the adder and the subtracter are used to produce from the output signal of the automatic gain control the error reference and error gradient signals which are applied to the complex correlator system.

The complex correlator system is used to receive the error reference and error gradient signals and to produce therefrom the tuning parameter signal needed to tune the notch filter to a center frequency of the narrow band noise component. Essentially, the complex correlator sums the product of the error reference and error gradient signals with the product of the Hilbert transform of the error reference and Hilbert transform of the error gradient signals to produce a strong error signal which is then scaled, applied to an accumulator (i.e., integrator), then further scaled and biased to produce the tuning parameter signal.

The apparatus and method of the present invention thus provides a means for tracking and attenuating a narrow band noise component of an input signal, where the narrow band noise component varies significantly in frequency. Importantly, the apparatus and method of the present invention performs its function without introducing tangible phase shift of the input signal. As such, the method and apparatus of the present invention is particularly well adapted for use in filtering the output signals of sensors used in airframe mounted sensors where the resonant frequency of the sensor output is temperature and time dependent, and where the filtering of the sensor output signal must be performed without introducing significant phase shift. The present invention also provides a means to isolate a narrowband noise of a signal for purposes of analysis, and without resorting to spectrum analysis methods which would require other problems such as bin resolution, window shaping, etc. to be addressed.

BRIEF DESCRIPTION OF DRAWINGS

The various advantages of the present invention will become apparent to one skilled in the art by reading the following specification and subjoined claims and by referencing the following drawings in which:

FIG. 5 is a block diagram of the complex correlator system shown in FIG. 1;

FIG. 6 is a block diagram of the automatic gain control system of FIG. 4;

DETAILED DESCRIPTION OF THE PREFERRED EMBODIMENTS

Figure 1:
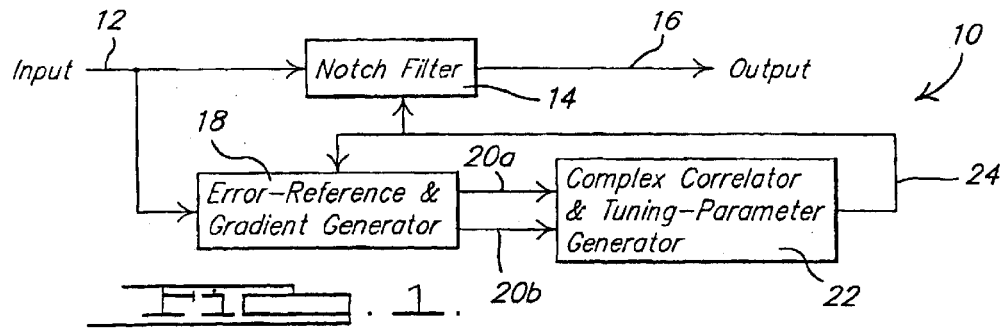
FIG. 1 is a simplified block diagram of an adaptive noise cancelling system in accordance with a preferred embodiment of the present invention.

Referring now to FIG. 1, there is shown an adaptive resonance canceller system 10 in accordance with a preferred embodiment of the present invention. An input signal 12 contaminated with narrow-band noise drives both notch filter 14 and error-reference and gradient generator 18. The rejection frequency of notch filter 14 is adjusted by tuning parameter 24. Notch filter 14 provides output signal 16 whose spectrum is substantially identical to that of input signal 12, but without the narrowband noise. Error-reference and gradient generator 18 provides two outputs, error reference 20a and error gradient 20b, both of which drive complex correlator and tuning parameter generator 22 whose output 24 is the tuning parameter signal for notch filter 14.

Figure 2:
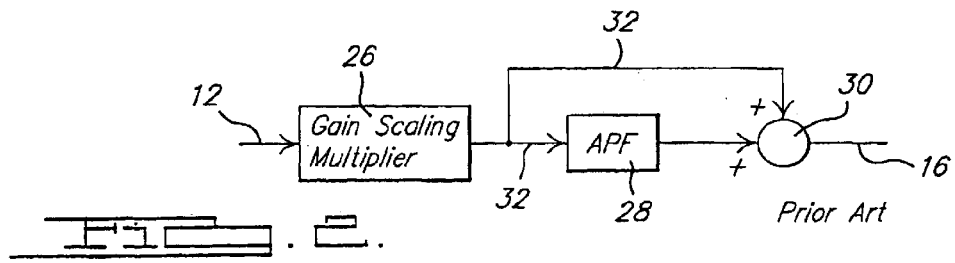
FIG. 2 is a block diagram of the notch filter of FIG. 1.

The preferred embodiment of notch filter 14 is displayed in FIG. 2. This embodiment of the notch filter 14 represents a prior-art configuration comprising a first scaling multiplier 26 which provides a gain of 0.5, a first biquadratic allpass filter 28 and a first adder 30. Input signal 12 is applied to the input of first scaling multiplier 26. The output 32 of first scaling multiplier 26 is applied to the input of first biquadratic filter 28 and to a first input of first adder 30. The output of biquadratic allpass filter 28 is connected to a second input of first adder 30. The output of first adder 30 is the output signal 16. This configuration was chosen for its ease of scaling and low sensitivity to coefficient tolerances. The performance of this notch filter is particularly robust when first biquadratic allpass filter 28 is implemented as described below.

Figure 3:
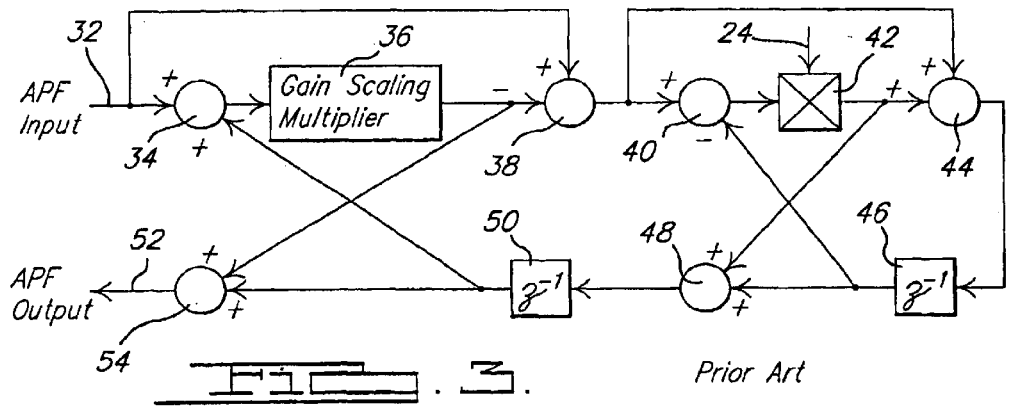
FIG. 3 is a block diagram of the allpass filter shown in FIG. 2.

FIG. 3 shows the preferred embodiment of the biquadratic allpass filter 28. This well-known prior-art embodiment is known as a second-order, recursive, single-multiplier-per-order Gray-Markel allpass lattice filter whose topology has been optimized for $L_1$ scaling. This structure was chosen for its ease of scaling, low sensitivity to coefficient tolerances, and low output roundoff noise. Input 32 to filter 28 is connected to a first input of second adder 34 and to the additive input of a first subtractor 38. The output of second adder 34 is connected to the input of a second gain-scaling multiplier 36, whose gain is preferably about 0.9. The output of second gain-scaling multiplier 36 is connected to the subtractive input of first subtractor 38 and to a first input of a fifth adder 52. The output of first subtractor 38 is connected to the additive input of a second subtractor 40 and to a first input of a third adder 44. The output of second subtractor 40 is connected to a first input of first signal multiplier 42 whose second input is tuning parameter signal 24. The output of first signal multiplier 42 is connected to the second input of third adder 44 and a first input of a fourth adder 48. The output of third adder 44 is connected to the input of a first unit-delay element 46 whose output drives the subtractive input of second subtractor 40 and the second input to fourth adder 48. The output of fourth adder 48 drives the input to a second unit-delay element 50, whose output drives the second input to second adder 34 and the second input to fifth adder 52. The output 54 of fifth adder 52 is the output of the allpass filter. No further description of this filter will be provided because it is well understood to those skilled in the art.

Figure 4:
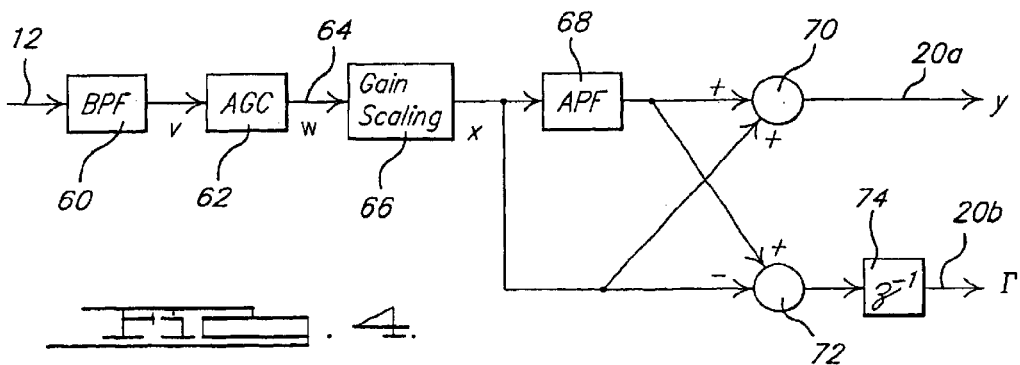
FIG. 4 is a block diagram of the error reference and gradient generator of FIG. 1.
Figure 7:
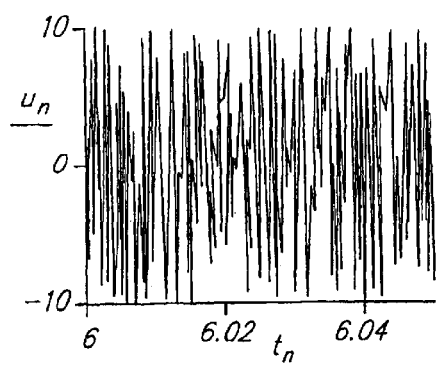
FIG. 7 represents a sample of an excitation signal received by the sensor having a narrow band noise component.
Figure 8:
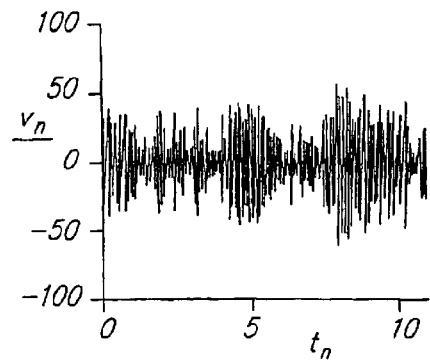
FIG. 8 represents the noisy output of the sensor.
Figure 9:
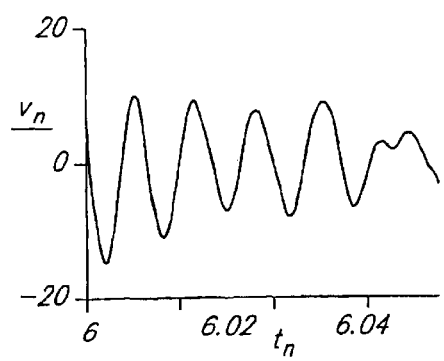
FIG. 9 represents a highly magnified graph of a portion of the narrow band noise signal from the sensor output.

Referring to FIG. 4, the error-reference and gradient generator 18 is shown in greater detail. Input signal 12 is connected to a bandpass filter 60. The specifications on bandpass filter 60 are few: the expected maximum and minimum frequencies of the narrowband noise must lie within the passband, the passband must be smooth (which suggests Butterworth or inverse Chebychev designs), and the stopband must substantially reject other significant spectral components. Filters from 10th order down to 6th order have been used successfully and it is anticipated that a fourth-order filter would suffice. The output, "v", of bandpass filter 60 drives an automatic-gain control (AGC) 62 whose preferred embodiment is shown in FIG. 6. Signal 64, "w", from AGC 62 is substantially the gain-controlled narrowband noise. Signal 64 drives a third scaling element 66 whose gain is ½. The output, "x", of third scaling element 66 is connected to the input of a second allpass filter 68 (identical to first allpass filter 28), to the first input of a sixth adder 70, and to the subtractive input of a third subtractor 72. The output of second allpass filter 68 is connected to the second input of sixth adder 70 and to the additive input of third subtracter 72. The output of third subtracter 72 is connected to the input of third unit-delay element 74. Elements 66, 68, and 70 comprise a notch-filter, the power of whose output signal 20a, "y", is to be minimized. Elements 66, 68, 72, and 74 compute the gradient 20b of output signal 20a with respect to the tuning parameter 24. It will be noted that the product of signals 20a and 20b is the scaled gradient of the power of signal 20a with respect to the tuning parameter signal 24.

FIG. 5 shows the complex correlator and tuning parameter generator 22. Signal 20a from error reference and gradient generator 18 is connected to the additive input of a fourth subtractor 80 and to the input of a fourth unit-delay element 76. The output of unit delay element 76 is in turn connected to a first input of a second signal multiplier 82 and to the input of a fifth unit-delay element 78, whose output is in turn connected to the subtractive input of a fourth subtractor 80. Similarly, signal 20b from error reference and gradient generator 18 is connected to the additive input of a fifth subtractor 88 and to the input of a sixth unit-delay element 84. The output of sixth unit delay element 84 is in turn connected to the second input of second signal multiplier 82 and to the input of a seventh unit-delay element 86, whose output is in turn connected to the subtractive input of fifth subtractor 88. The two inputs of a third signal multiplier 90 are connected to the outputs of subtractors 80 and 88. The output of third signal multiplier 90 is scaled by $K_1$ in a fourth scaling multiplier 92, then summed in a seventh adder 94 with the output of second signal multiplier 82. The output of the seventh adder 94 represents the sum of the product of the error and error gradient with the product of the Hilbert transform of the error and the Hilbert transform of the error gradient. This is the signal that the system 10 ultimately drives toward zero.

The output of seventh adder 94 is scaled by $K_2$ (a factor of 0.0625) in a fifth scaling multiplier 96 (which controls the rate and the granularity of adaptation), then applied to an accumulator loop 98 as a first input to an eighth adder 100. The output of eighth adder 100 is limited to +1 and −1 by a first saturation element 102 whose output, in turn, is connected to eighth unit-delay element 104. The output signal 106, "p", of eighth unit-delay element 104 is connected to the second input of eighth adder 100 and to the input of a sixth scaling multiplier 108 which scales signal 106 by $K_3$. The output of sixth scaling multiplier 108 is subsequently biased by $K_4$ in a ninth adder 110 in order to provide tuning parameter 24.

FIG. 6 shows the AGC 62 in greater detail. The AGC 62 is required for the system 10 because of the changes in the amplitude of the narrowband noise. There are strong interactions between the time constant of the notch filter 14, the constants $K_2$, $K_3$ and $K_4$ in the Tuning Parameter Generator 22, the gains in the AGC 62, and the overall system 10 performance. The output, "v", of bandpass filter 60 is connected to a first input of a fourth signal multiplier 112, whose output is connected to the input of a second saturation element 114. The output of a ninth unit-delay element 124 is connected to the second input of fourth signal multiplier 112, to the input of a seventh gain-scaling element 116, which scales its input signal by a factor of $2^{-4}$, and to the input of an eighth gain-scaling element 120 which scales its input signal by a factor of $1+2^{-16}$. The output of seventh gain-scaling element 116 is connected to a first input of a tenth adder 122 through a switch 118. The output of eighth gain-scaling element 120 is connected to the second input of tenth adder 122. The output of tenth adder 122 is connected to the input of ninth unit-delay element 124, which is initialized with a value of "1". Second saturation element 114 saturates at unit amplitude. When saturation occurs, switch 118 is closed, otherwise switch 118 remains open.

The method of the present invention follows the operation of the above-described components. Essentially, this involves using the notch filter 14 to attenuate the narrowband noise component of the input signal 12. The input signal 12 is applied to the error reference and error gradient generator 18 to produce the error gradient and error reference signals 20a and 20b, respectively. These signals and their Hilbert transforms are multiplied together, summed, scaled, and then applied to an accumulator, with the output of the accumulator 98 being used to form the tuning parameter signal for tuning the notch filter to the center frequency of the narrowband noise component present in the input signal 12. This entire set of operations comprises the cross correlation operation.

The system and method of the present invention thus provides a means for attenuating narrowband noise signals that vary significantly in frequency in a manner without introducing phase shift of the input signal applied to the system 10. The system 10 enables the changing frequency of the noise component to be tracked and the center frequency of the notch filter to be adjusted accordingly. The system 10 is particularly well adapted for use with solid state sensors for generating body rate signals for attitude control in a flight control system, where it is undesirable to introduce any tangible phase shift of the sensor output signal.

FIGS. 7–18 are graphs representing an excitation input signal (FIG. 7) and the signals output at various stages of the system 10.

Equation 130 as follows represents the AGC 62:

$$AGC: g_0 := 1 g_{(n+1)} := g_n \cdot \lfloor 1 - 2^{-4} \cdot (|v_n \cdot g_n| > 1) + 2^{-16} \rfloor$$

Figure 10:
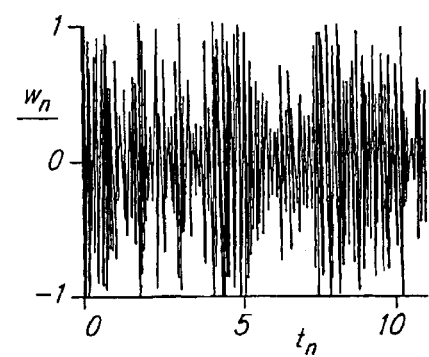
FIG. 10 represents a graph of the output of the automatic gain control of FIG. 4.
Figure 11:
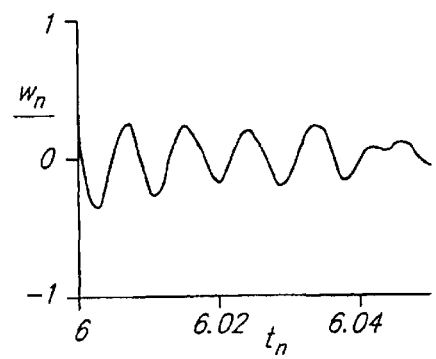
FIG. 11 represents a highly magnified plot of a small portion of the signal shown in FIG. 10.
Figure 12:
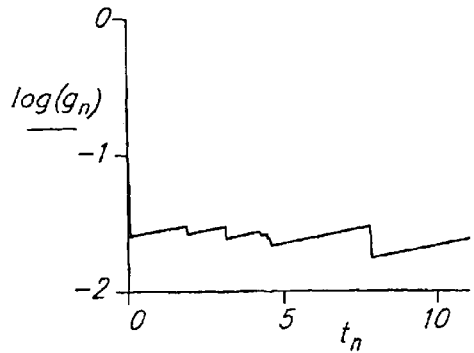
FIG. 12 represents a graph of the automatic gain control (AGC) control signal due to the operation of the switch in the AGC circuit shown in FIG. 6.

Equation 132 as follows represents the signal $w_n$ associated with FIG. 10:

$$w_n := SAT(v_n \cdot g_n, 1)$$

The following statements represent various parameters for the system 10:

$$\alpha := 0.9 REF_0 := 0 \Gamma_0 := 0 p_0 := 0 y_0 := 0 x_0 := \alpha \cdot w_0 z_0 := 0 K_2 = 2^{-4} K_1 := 0.5 \cdot (1 - \beta'^2)^{-0.5}$$

Figure 18:
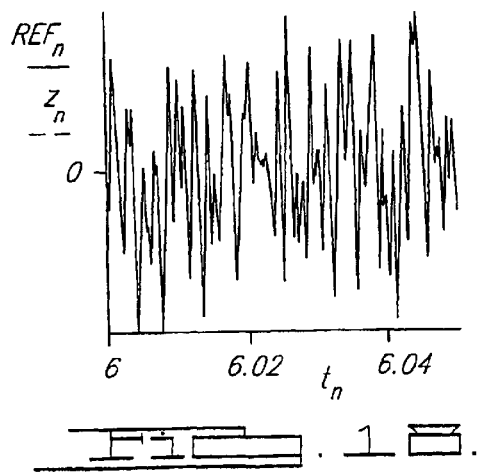
FIG. 18 is a highly magnified graph of a portion of the signal shown in FIG. 17 superimposed with the reference filter output.
Figure 19:
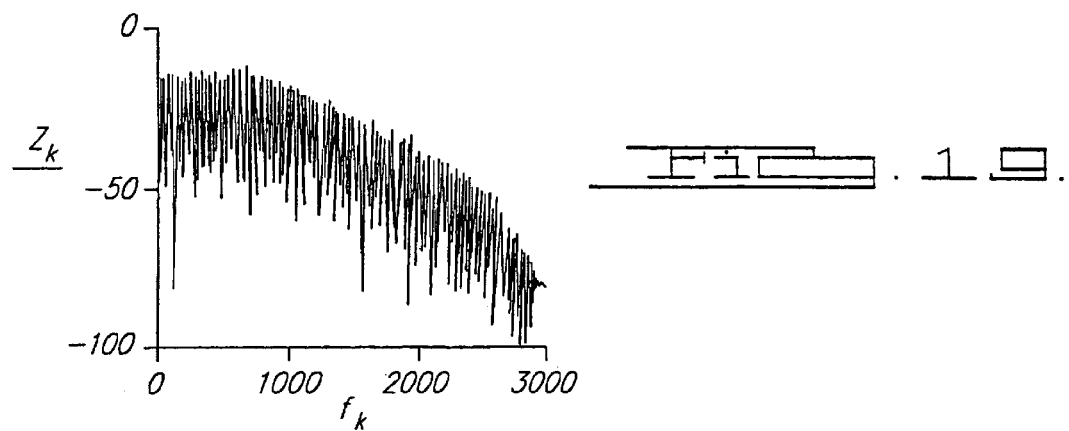
FIG. 19 is a graph of the frequency spectrum of the output of the system of the present invention.
Figure 20:
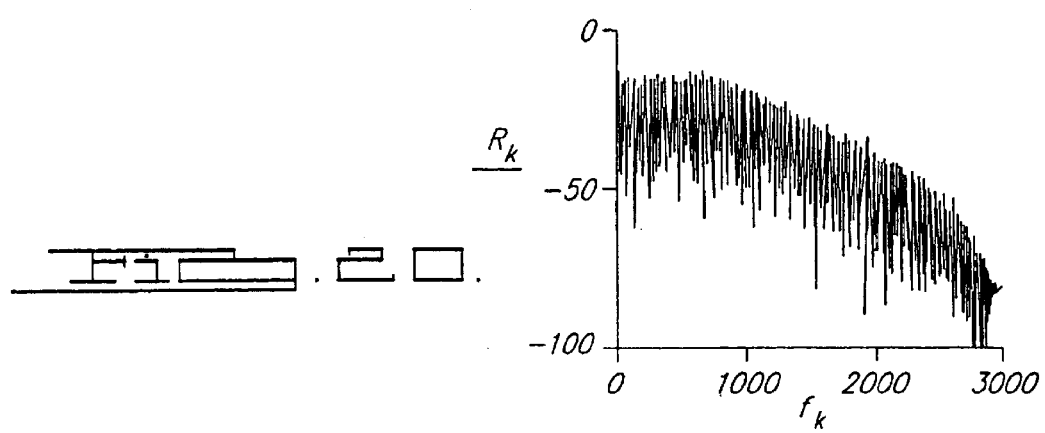
FIG. 20 is a graph of the frequency spectrum of the reference signal showing the nearly identical nature of that signal with the signal shown in FIG. 19.
Figure 21:
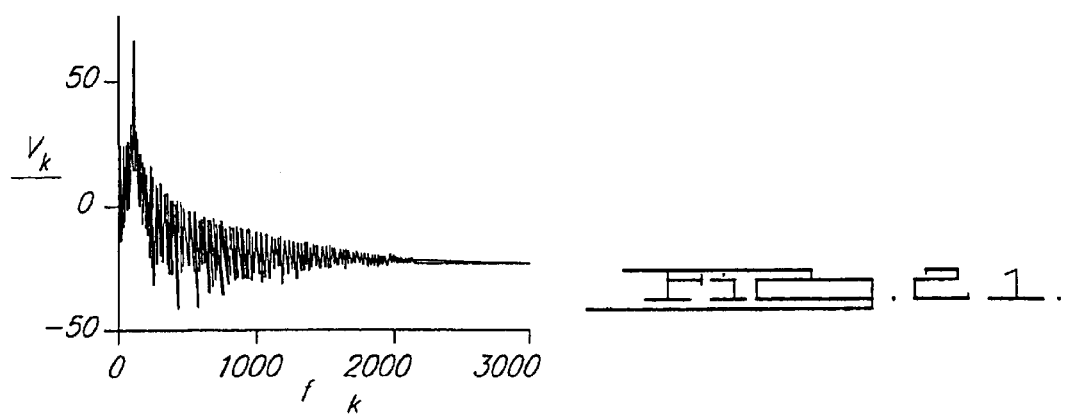
FIG. 21 is a graph of the frequency spectrum of the input signal to the system of the present invention.

Equation 134 as follows represents the reference signal shown in FIG. 18:

$$REF_n := \frac{(1+\alpha)}{2} \cdot \left[ v_n + (n \geq 1) \cdot 2 \cdot \beta_o \cdot [v_{(n-1)} - REF_{(n-1)}] + (n \geq 2) \cdot \left[ v_{(n-2)} - \frac{(2 \cdot \alpha)}{(1+\alpha)} \cdot REF_{(n-2)} \right] \right]$$

Figure 13:
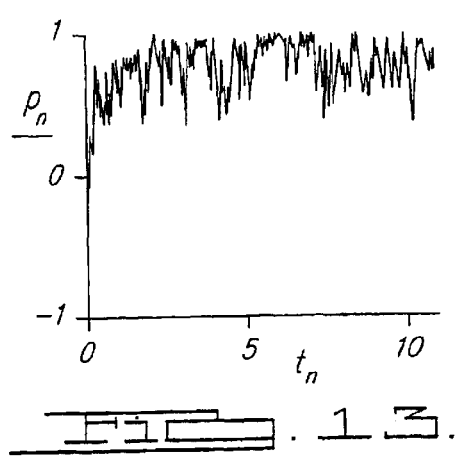
FIG. 13 is a graph of the output of the accumulator of FIG. 5.
Figure 15:
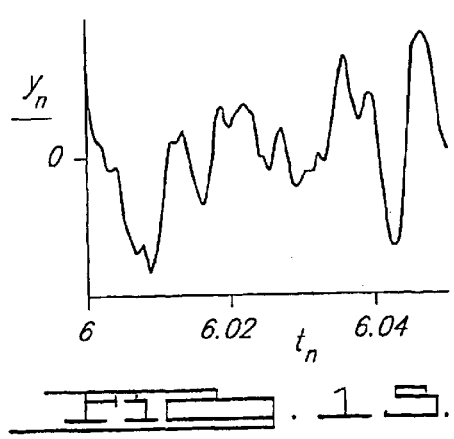
FIG. 15 is a time series graph of the error reference signal.
Figure 16:
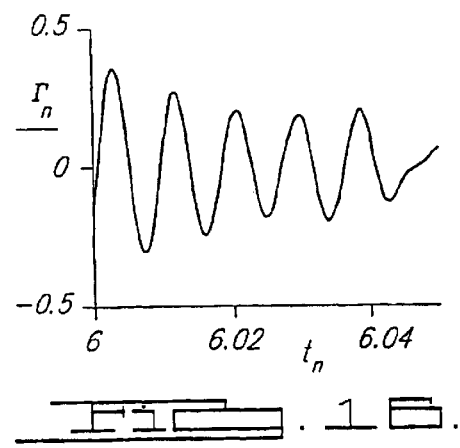
FIG. 16 is a time series graph of the error gradient signal.
Figure 17:
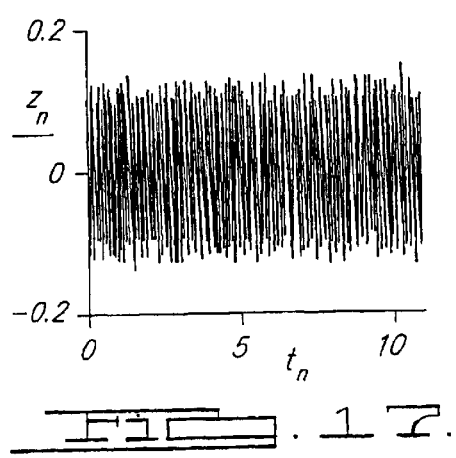
FIG. 17 is a time series graph of the output of the system of the present invention.

Equation 136 below represents the signals shown in FIGS. 13, 15 and 16:

$$\begin{bmatrix} x_n \\ y_n \\ \Gamma_n \\ p_n \end{bmatrix} := \begin{bmatrix} \alpha \cdot w_n + (n \geq 2) \cdot [w_{(n-2)} - \alpha \cdot x_{(n-2)}] + (n \geq 1) \cdot \\ [\beta' + \Delta\beta \cdot p_{(n+1)}](1+\alpha)[w_{(n-1)} - x_{(n-1)}] \\ (n \geq 1) \cdot 0.5 \cdot [x_{n-1} + w_{(n-1)}] \\ (n \geq 2) \cdot 0.5 \cdot [x_{(n-2)} + w_{(n-2)}] \\ SAT[(n \geq 1) \cdot p_{(n-1)} + (n \geq 3) \cdot K_2 \cdot [y_{(n-2)} \cdot \Gamma_{(n-2)} + K_1^2 \cdot [y_{(n-1)} - y_{(n-3)}] \cdot [\Gamma_{(n-1)} - \Gamma_{(n-3)}]]1] \end{bmatrix}$$

Figure 14:
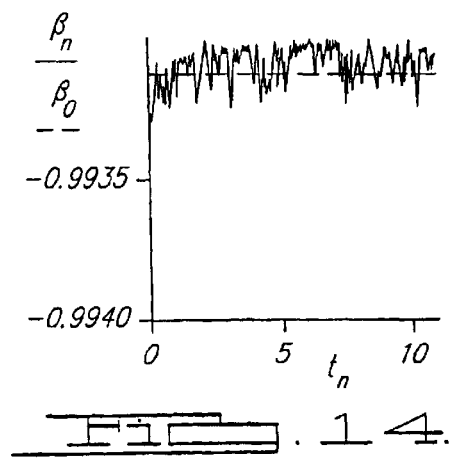
FIG. 14 is a time series graph of the tuning parameter signal.

Equation 138 below represents the two signals shown in FIG. 14:

$$\beta_n := \beta' + \Delta\beta \cdot p_n$$

$$z_n := \frac{(1+\alpha)}{2} \cdot \left[ v_n + (n \geq 1) \cdot 2 \cdot \beta_n \cdot [v_{(n-1)} - z_{(n-1)}] + (n \geq 2) \cdot \left[ v_{(n-2)} - \frac{(2 \cdot \alpha)}{(1+\alpha)} z_{(n-2)} \right] \right]$$

The following equations 140–144 further represent the variance of the input signal, the system 10 output variation and the reference filter (FIG. 18) variation, respectively:

Equation 140 (output variance)

$$V'_m := v_{(m+M)} var(v') = 369.002 V := 20 \cdot Re(\log(\mathit{fft}(v))) \max(V = 63.605$$

Equation 142 (system 10 output variance)

$$Z'_m := z_{(m+M)} var(z') = 0.002 Z := 20 \, Re(\log(\mathit{fft}(z'))) \, \max(Z) = -13.214$$

Equation 141 (Reference filter output variance)

$$REF'_m := REF_{(m+M)} var(REF') = 0.002 R := 20 \, Re(\log(\mathit{fft}(REF'))) \\ \max(R) = -13,211$$

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

Appendix

ADAPTIVE NOTCH FILTER

SAT (X, Y) := if  
(X > Y, 1, if (X < -Y, -1, X))  
$N := 2^{16}$  
$M := 0.5 \cdot N$  
$K := 0.5 \cdot N$ SGN(X) := if  
(X > 0, 1, if (X < 0, -1, 0))  
N time samples of the input signal.

n := 0 ... N - 1  
m := 0 ... M - 1  
k := 0 ... K

N = 65536

Compute the performance statistics only on the last half of the signal to ensure that the start-up transients have died away. The frequency-domain index is k, and the time base is t.

$f_s := 6000$ Hz   $T := f_s^{-1}$  
$t_n := n \cdot T$   $\max(t) = 10.922 \cdot s$   the time base is t.  
$f_{max} := 113$ Hz   $f_{min} := 107$ Hz   The allowable frequency range for the resonance.  
$f_o := 112$ Hz  
$f_k := 0.5 \cdot f_s \cdot \frac{k}{K}$   Generate a resonance centered at $f_o$ Hz; i is simply a useful index: i := 0 ... 2

The βs are the tuning parameters corresponding to various frequencies:

$\beta_{max} := -\cos(2 \cdot \pi \cdot f_{max} \cdot T)$       $\beta_{max} = -0.993$ $\beta_o := -\cos(2 \cdot \pi \cdot f_o \cdot T)$       $\beta_o = -0.993$ $\beta_{min} := -\cos(2 \cdot \pi \cdot f_{min} \cdot T)$       $\beta_{min} = -0.994$ $\Delta\beta := 0.5 \cdot (\beta_{max} - \beta_{min})$       $\Delta\beta = 0.0003610851$ $\beta' := 0.5 \cdot (\beta_{max} + \beta_{min})$       $\beta' = 0.9933678635$ $r := 2 \cdot \pi \cdot (-0.29 \text{ Hz} + j \cdot f_0)$       $r = -1.822 + 703.717 j \cdot s^{-1}$ $r' := \frac{2}{T} \cdot \left( \tan\left(\frac{T}{2} \cdot Re(r)\right) + j \cdot \tan\left(\frac{T}{2} \cdot Im(r)\right) \right)$    $r' = 1.822 + 704.525 j \cdot s^{-1}$ $R := \frac{(2 + r' \cdot T)}{(2 - r' \cdot T)}$       $R = 0.992829 + 0.116982 j$ $|R| = 0.999697$ $A := \frac{[(1-R) \cdot (1-\overline{R})]}{4} \cdot \begin{bmatrix} 1 \\ 2 \\ 1 \end{bmatrix}$       $B := \begin{bmatrix} 0 \\ -(R + \overline{R}) \\ R \cdot \overline{R} \end{bmatrix}$ The difference-equation parameters of the resonator are the A's and B's.

A zero mean, uniformly distributed white noise excitation signal of amplitude L is u; the output of the resonator is v; the AGC output is w:

$$L := 10 u_n := L \cdot (rnd(2)-1) v_0 := 0$$

$$v_n := Re\left[ \sum_i (n \geq i) \cdot [A_i \cdot u_{(n-i)} - B_i \cdot v_{(n-i)}] \right]$$

This difference equation generates the resonator signal.

What is claimed is:

1. An adaptive noise canceling system for tracking and canceling a narrowband noise component present in an output signal of an electronic component without introducing tangible phase shift to said output signal, and wherein said narrowband noise component varies in frequency over a broad frequency spectrum, said noise canceling system comprising:

a notch filter having a first input for receiving said output signal from said electronic component, said output signal containing said narrowband noise component;

a first scaling multiplier responsive to said output signal from said electronic component;

an error reference and gradient system including:
- a first input responsive to said output signal from said electronic component for generating an error reference signal and an error gradient signal, and
- a bandpass filter for receiving said output signal from said electronic component, and having a passband sufficiently broad to encompass expected minimum and maximum frequencies of said noise component;
- an automatic gain control circuit responsive to an output of said bandpass filter;
- a scaling element responsive to an output of said automatic gain control circuit;
- a biquadratic allpass filter responsive to an output of said scaling element;
- an adder for summing an output of said biquadratic allpass filter and said output of said scaling element;
- a subtractor for receiving said output from said scaling element and said biquadratic allpass filter and producing a difference output signal;
- a unit delay element responsive to said difference output signal of said subtractor;
- wherein an output of said adder comprises said error reference signal, and said output of said unit delay element comprises said error gradient signal;
- a correlator system responsive to said error reference signal and said error gradient signal for generating a tuning parameter signal, said tuning parameter signal being applied to a second input of said notch filter for tuning said notch filter, in real time, to a center frequency of said narrowband noise component, such that said narrowband noise component can be removed by said notch filter; and
- wherein said error reference and gradient system includes a second input responsive to said tuning parameter signal for modifying said error reference and error gradient signals, in closed loop fashion, to thereby track said narrowband noise component in real time.

2. The system of claim 1, wherein said notch filter comprises:
- a biquadratic allpass filter responsive to the output of said first scaling multiplier; and
- a first adder for summing an output of said biquadratic allpass filter and an output of said first scaling multiplier.

3. The system of claim 2, wherein said biquadratic allpass filter comprises a second-order, recursive, single-multiplier-per-order Gray-Markel allpass lattice filter.

4. The system of claim 1, wherein said correlator system comprises:
- a first 90 degree phase shifting circuit for receiving the error reference signal;
- a second 90 degree phase shifting circuit for receiving the error gradient signal;
- a first unit delay element operably associated with said first 90 degree phase shifting circuit for producing a first output signal;
- a second unit delay element operably associated with said second 90 degree phase shifting circuit for producing a second output signal;
- a first signal multiplier for receiving and multiplying said first and second output signals to produce a third output signal;
- a second signal multiplier responsive to outputs from said first and second 90 degree phase shifting circuits;

- an adder having a first input responsive to an output of said second signal multiplier and a second input responsive to said third output signal, to produce a fourth output signal; and
- an integrator responsive to said fourth output signal for generating a fifth output signal representative of said tuning parameter signal.

5. An adaptive noise canceling system for tracking and canceling a narrowband noise component present in an output signal of a solid state sensor without introducing tangible phase shift to said output signal of said sensor, and wherein said narrowband noise component varies in frequency over a broad frequency spectrum, said system comprising:
- a notch filter having a first input for receiving said output signal from said sensor, said output signal containing said narrowband noise component;
- an error reference and gradient system including:
  - a bandpass filter responsive to said output signal from said sensor for defining a frequency window of sufficient spectral width to encompass anticipated minimum and maximum frequencies of said noise component;
  - an automatic gain control responsive to an output of said bandpass filter for modifying the gain of a signal output from said bandpass filter;
  - an allpass filter responsive to an output from said automatic gain control;
  - a first summing component responsive to an output of said allpass filter and said output from said automatic gain control for generating an error reference signal;
  - a second summing component responsive to said output of said allpass filter and said output of said automatic gain control for generating an error gradient signal; and
- a correlator system responsive to said error reference signal and said error gradient signal for generating therefrom a tuning parameter signal, said tuning parameter signal being applied to a second input of said notch filter for tuning said notch filter, in real time, to a center frequency of said narrowband noise component, such that said narrowband noise component can be removed by said notch filter.

6. The system of claim 5, wherein said error reference and gradient system includes a second input responsive to said tuning parameter signal for modifying said error reference and error gradient signals, in closed loop fashion, to thereby track said narrowband noise component in real time.

7. The system of claim 5, wherein said correlator circuit comprises:
- a first 90 degree phase shifting circuit for receiving the error reference signal;
- a second 90 degree phase shifting circuit for receiving the error gradient signal;
- a first unit delay element operably associated with said first 90 degree phase shifting circuit for producing a first output signal;
- a second unit delay element operably associated with said second 90 degree phase shifting circuit for producing a second output signal;
- a first signal multiplier for receiving and multiplying said first and second output signals to produce a third output signal;
- a second signal multiplier responsive to outputs from said first and second 90 degree phase shifting circuits;

an adder for summing an output of said second signal multiplier and said third output signal, to produce a fourth output signal; and an integrator responsive to said fourth output signal for generating a fifth output signal representative of said tuning parameter signal.

8. The system of claim 7, wherein each of said first and second 90 degree phase shifting circuits comprise first and second unit delay elements, and a subtracter responsive to an output from the second one of said delay elements and also to said one of said error reference or said error gradient signals.

9. The system of claim 7, further comprising a scaling multiplier for receiving said output from said integrator and scaling said integrator output by a desired factor.

10. The system of claim 9, further comprising an adder for receiving an output signal from said scaling multiplier and biasing said scaling multiplier output to produce said tuning parameter signal.

11. The system of claim 5, wherein said notch filter comprises:

a first scaling multiplier responsive to said output signal from said sensor;

a biquadratic allpass filter responsive to an output of said first scaling multiplier; and a first adder responsive to an output of said biquadratic allpass filter and an output of said first scaling multiplier.

12. The system of claim 11, wherein said biquadratic allpass filter comprises a second-order, recursive, single-multiplier-per-order Gray-Markel allpass lattice filter.

13. The system of claim 5, further comprising a scaling element responsive to said output of said automatic gain control for scaling said automatic gain control output by a factor of approximately 0.5.

14. A method for tracking and canceling a narrowband noise component present in an output signal of a sensor without introducing tangible phase shift to said output signal of said sensor, and wherein said narrowband noise component varies in frequency over a broad frequency spectrum, said method comprising the steps of:

using a notch filter having a first input for receiving said output signal from said sensor and a second input for receiving a tuning parameter to produce an output signal having a spectrum substantially identical to that of said output signal of sensor but without said noise component;

using an error reference and error gradient circuit to receive said output signal from said sensor and to define a frequency window within which said noise component is expected to be present, and to generate a tuning parameter error reference signal and a tuning parameter error gradient signal, including:

using a bandpass filter for receiving said output signal from said sensor, and having a passband sufficiently broad to encompass expected minimum and maximum frequencies of said noise component to substantially isolate said narrowband noise component of said output signal of said sensor;

using an automatic gain control circuit responsive to an output of said bandpass filter to control a power level of said bandpass filter noise component;

using a scaling element responsive to an output of said automatic gain control circuit to implement said power level setting determined by said automatic gain control circuit;

using biquadratic allpass filter responsive to an output of said scaling element and said tuning parameter to produce a phase shifted version of the output of said automatic gain control circuit;

summing an output of said biquadratic allpass filter and said output of said scaling element to produce a summed signal to generate a tuning parameter error signal;

producing a difference output signal based on said output from said scaling element and said biquadratic allpass filter to generate a facsimile of the gradient of said tuning parameter error gradient signal with respect to said tuning parameter of said notch filter;

providing a unit delay element responsive to said difference output signal to produce a true time delay corrected error tuning parameter error gradient reference signal;

outputting said tuning parameter error signal as a component of the summed signal, and using said unit delay element to output said tuning parameter error gradient signal to provide input components to a correlator circuit;

using said correlator circuit to receive said tuning parameter error reference and gradient signals and to generate said tuning parameter signal, said tuning parameter signal being adapted to tune said biquadratic allpass filter and said notch filter to a center frequency of said narrowband noise component; and applying said tuning parameter to said notch filter to tune said notch filter such that said notch filter is able to filter said noise component from said output of said sensor.

15. The method of claim 14, further comprising the step of applying said tuning parameter signal to an input of said error reference and error gradient circuit, in closed loop fashion, to thereby modify said error reference and error gradient signals.

* * * * *